(12) United States Patent
Hsieh et al.

(10) Patent No.: US 11,201,125 B2
(45) Date of Patent: Dec. 14, 2021

(54) SEMICONDUCTOR PACKAGE AND SEMICONDUCTOR PROCESS

(71) Applicant: Advanced Semiconductor Engineering, Inc., Kaohsiung (TW)

(72) Inventors: Sheng-Chi Hsieh, Kaohsiung (TW); Hung-Yi Lin, Kaohsiung (TW); Cheng-Yuan Kung, Kaohsiung (TW); Pao-Nan Lee, Kaohsiung (TW); Chien-Hua Chen, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 15/442,492

(22) Filed: Feb. 24, 2017

(65) Prior Publication Data
US 2018/0247904 A1 Aug. 30, 2018

(51) Int. Cl.
| | |
|---|---|
| *H01L 23/66* | (2006.01) |
| *H01L 23/498* | (2006.01) |
| *H03H 3/08* | (2006.01) |
| *H03H 9/05* | (2006.01) |
| *H03H 9/10* | (2006.01) |
| *H03H 3/02* | (2006.01) |
| *H01L 23/64* | (2006.01) |

(52) U.S. Cl.
CPC ........ *H01L 23/66* (2013.01); *H01L 23/49827* (2013.01); *H01L 23/49838* (2013.01); *H01L 23/49894* (2013.01); *H01L 23/642* (2013.01); *H01L 23/645* (2013.01); *H03H 3/02* (2013.01); *H03H 3/08* (2013.01); *H03H 9/0523* (2013.01); *H03H 9/0557* (2013.01); *H03H 9/1014* (2013.01); *H03H 9/1071* (2013.01); *H01L 2223/6616* (2013.01); *H01L 2223/6672* (2013.01)

(58) Field of Classification Search
CPC ............. H01L 23/66; H03H 1/00; H03H 3/08
USPC .......................................................... 333/32
See application file for complete search history.

(56) References Cited

U.S. PATENT DOCUMENTS

| | | |
|---|---|---|
| 8,093,982 B2 | 1/2012 | Kim et al. |
| 8,558,356 B2 | 10/2013 | Kiwitt et al. |

(Continued)

FOREIGN PATENT DOCUMENTS

CN  103138709 A  6/2013

OTHER PUBLICATIONS

Office Action for corresponding Chinese Patent Application No. 201711305624.4 dated Nov. 27, 2020, 6 pages.

(Continued)

*Primary Examiner* — Samuel S Outten
(74) *Attorney, Agent, or Firm* — Foley & Lardner LLP

(57) ABSTRACT

The present disclosure relates to a semiconductor package and a method of manufacturing the same. In some embodiments, a semiconductor package includes a substrate, at least one die, a sealing ring and an inductor. The at least one die is mounted on the substrate and includes a plurality of component structures operating with acoustic waves. The component structures are arranged on a side of the at least one die that faces the substrate. The sealing ring is disposed between the at least one die and the substrate and surrounds the component structures. The inductor is disposed in the substrate.

8 Claims, 8 Drawing Sheets

(56) References Cited

U.S. PATENT DOCUMENTS

| | | | |
|---|---|---|---|
| 9,099,987 B2 | 8/2015 | Maurer et al. | |
| 2009/0058555 A1* | 3/2009 | Takata | H03H 9/0576 333/129 |
| 2010/0091473 A1* | 4/2010 | Kiwitt | H03H 9/0561 361/782 |
| 2011/0149519 A1 | 6/2011 | Choudhury et al. | |
| 2012/0086524 A1* | 4/2012 | Komura | H03H 9/725 333/195 |
| 2012/0112850 A1* | 5/2012 | Kim | H03H 7/38 333/32 |
| 2014/0118084 A1* | 5/2014 | Takemura | H03H 9/0576 333/133 |
| 2015/0303888 A1* | 10/2015 | Yen | H03H 7/0115 333/175 |
| 2016/0142040 A1* | 5/2016 | Yasuda | H03H 9/6483 333/133 |
| 2017/0163243 A1* | 6/2017 | Bulger | H03H 9/0576 |

OTHER PUBLICATIONS

Search Report for corresponding Chinese Patent Application No. 201711305624.4 dated Nov. 27, 2020, 4 pages (with English translation).

* cited by examiner

SEMICONDUCTOR PACKAGE AND SEMICONDUCTOR PROCESS

BACKGROUND

1. Technical Field

The present disclosure relates to a semiconductor package and a method of manufacturing the same, and more particularly to a semiconductor package including integrated passive devices and a method of manufacturing the same.

2. Description of the Related Art

Bulk acoustic wave (BAW) filters and surface acoustic wave (SAW) filters are widely used in mobile phones, tablet devices, etc. For fourth generation (4G) mobile phones, each mobile phone may include about 15 bands, each band may include about 2 to about 4 BAW and/or SAW filters, and each BAW and/or SAW filter may include at least about 2 to about 4 high-quality (high-Q) capacitors and inductors for impedance matching. According to recent developments of wireless communications, the number of bands in a mobile phone is expected to increase to about 30 to about 50. For example, about 100 BAW and/or SAW filters and about 200 to about 400 capacitors and inductors may be included in one mobile phone. In some aspects, filter content is the fastest growing segment in radio frequency front-ends. Accordingly, integrating passive devices and reducing manufacturing costs become primary challenges in semiconductor packaging. Semiconductor devices have become progressively more complex, driven at least in part by the demand for smaller sizes and enhanced processing speeds. For example, there is a demand to further decrease the size of many electronic products including these semiconductor devices.

SUMMARY

In accordance with some embodiments of the present disclosure, a semiconductor package includes a substrate, at least one die, a sealing ring and an inductor. The die is mounted on the substrate and includes a plurality of component structures operating with acoustic waves. The component structures are arranged on a side of the die that faces the substrate. The sealing ring is disposed between the die and the substrate and surrounds the component structures. The inductor is disposed in the substrate.

In accordance with some embodiments of the present disclosure, a semiconductor wafer includes a wafer carrier, a plurality of dies, a plurality of sealing rings and an inductor. The plurality of dies are mounted on the wafer carrier. Each of the plurality of dies includes a plurality of component structures operating with acoustic waves. The component structures are arranged on a side of the die that faces the wafer carrier. Each of a respective one of the sealing rings is disposed between the wafer carrier and a corresponding one of the plurality of dies. Each of the plurality of sealing rings surrounds respective ones of the component structures of each of the dies. The inductor is disposed in the wafer carrier.

In accordance with some embodiments of the present disclosure, a method of manufacturing a semiconductor package includes: providing a wafer-level substrate; mounting at least one die on the wafer-level substrate, the wafer-level substrate being a cap for the die, the at least one die including a plurality of component structures operating with acoustic waves and arranged on a side of the at least one die that faces the wafer-level substrate; providing a sealing ring between the wafer-level substrate and the at least one die, the sealing ring surrounding the component structures; forming an inductor in the wafer-level substrate; and cutting the wafer-level substrate to form a wafer-level package.

BRIEF DESCRIPTION OF THE DRAWINGS

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
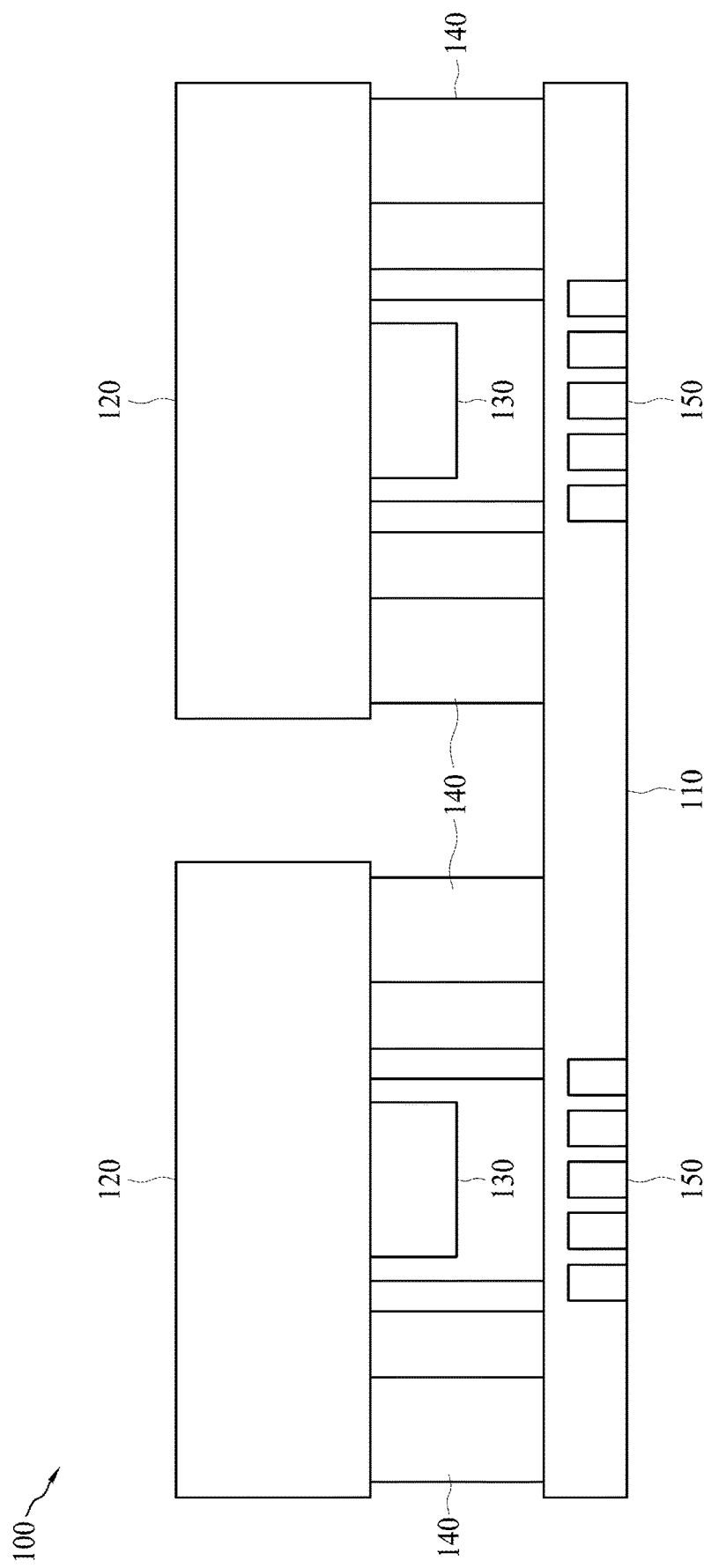
FIG. 1 illustrates a cross-sectional view of a semiconductor package in accordance with some embodiments of the present disclosure.

FIG. 1 illustrates a cross-sectional view of a semiconductor package in accordance with some embodiments of the present disclosure. Referring to FIG. 1, the semiconductor package 100 includes a substrate 110 and at least one die 120. The at least one die 120 includes a plurality of component structures 130 operating with acoustic waves. The component structures 130 are arranged on a side of the at least one die 120 that faces the substrate 110. The semiconductor package 100 further includes a sealing ring 140, which is disposed between the at least one die 120 and the substrate 110. The sealing ring 140 surrounds the component structures 130, so as to protect the at least one die 120. The semiconductor package 100 further includes an inductor 150 for impedance matching. The inductor 150 is formed or disposed in the substrate 110. In various embodiments, the inductor 150 may be a spiral inductor or a three-dimensional (3D) inductor. Forming an inductor in a substrate refers to embedding the inductor in the substrate, or forming the inductor on the substrate.

Figure 2:
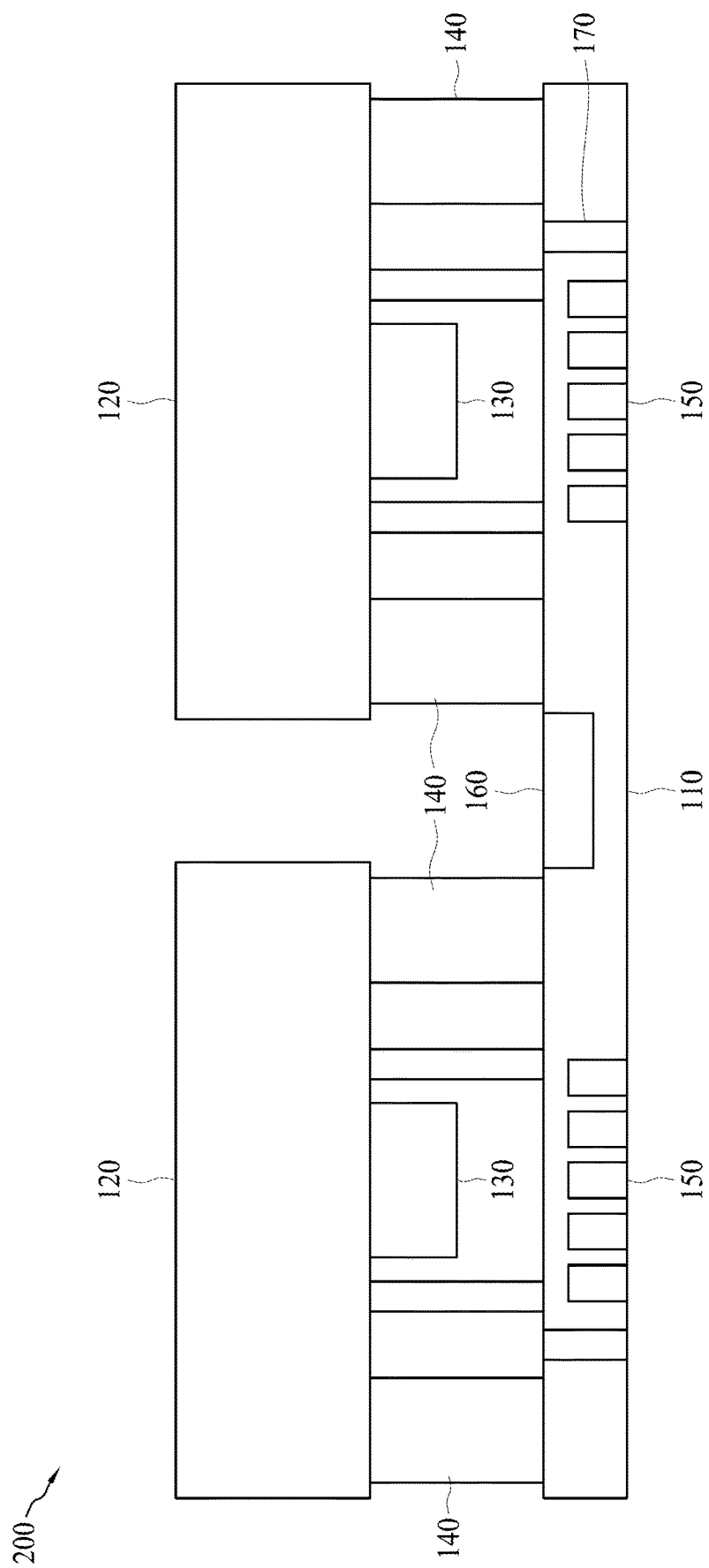
FIG. 2 illustrates a cross-sectional view of a semiconductor package in accordance with some embodiments of the present disclosure.

FIG. 2 illustrates a cross-sectional view of a semiconductor package 200 in accordance with some embodiments of the present disclosure. Referring to FIG. 2, the semiconductor package 200 further includes a capacitor 160 formed or disposed on the substrate 110 and electrically connected to the inductor 150. The capacitor 160 faces the component structures 130. Additionally, the semiconductor package 200 further includes a through hole connector 170. The through hole connector 170 is formed in the substrate 110 by a through-hole technology to provide electrical connections. In some embodiments, the semiconductor package 200 may include at least two dies.

According to some embodiments of the present disclosure, the semiconductor package provides integrated inductors and capacitors for impedance matching with the dies including component structures operating with acoustic waves, and provides a module for connecting individual components.

Figure 3:
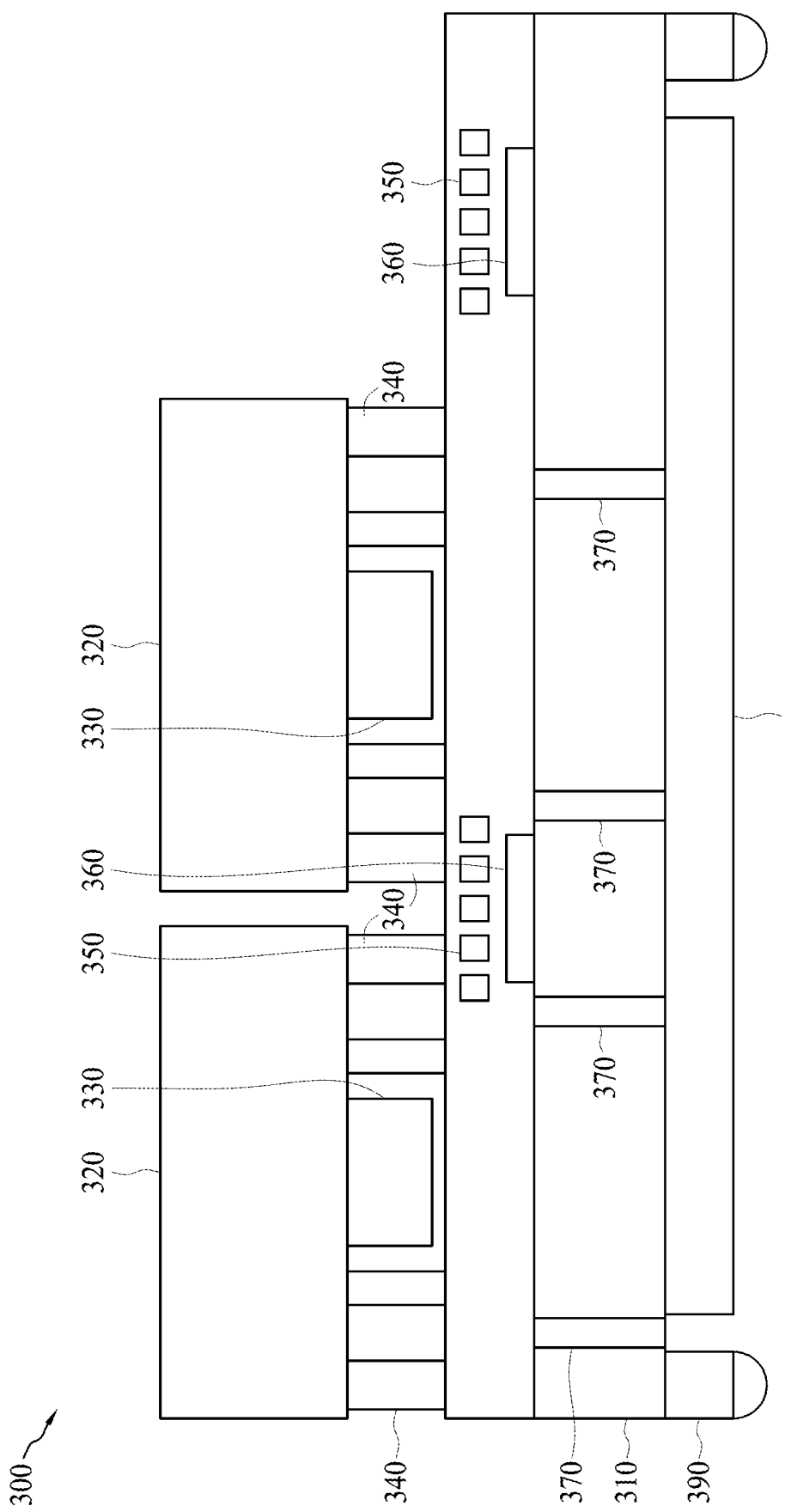
FIG. 3 illustrates a cross-sectional view of a semiconductor package in accordance with some embodiments of the present disclosure.

FIG. 3 illustrates a cross-sectional view of a semiconductor package 300 in accordance with some embodiments of the present disclosure. Referring to FIG. 3, the semiconductor package 300 includes a cap wafer 310, at least one die 320 including component structures 330 operating with acoustic waves, a sealing ring 340, inductors 350, capacitors 360 and through hole connectors 370. The inductors 350 and capacitors 360 are formed or disposed on a first side of the cap wafer 310 that faces the component structures 330. A power amplifier die 380 is mounted on a second side of the cap wafer 310 opposite to the first side of the cap wafer 310 and is electrically connected with the cap wafer 310 by the through hole connectors 370. A bottom sealing ring 390 is disposed on the same side of the cap wafer 310 on which the power amplifier die 380 is disposed. Thus, the semiconductor package 300 may provide an acoustic wave module.

The present disclosure provides flexibility in the design of the semiconductor package. If inductors and capacitors are arranged on the same side of a substrate that is used for bonding the substrate to the die, the space and area for the integrated passive devices may be limited. However, in some embodiments, inductors and capacitors can be arranged on the side of the substrate opposite the side that is used for bonding the substrate to the die, and electrical connections can be provided by through hole connectors.

Figure 4:
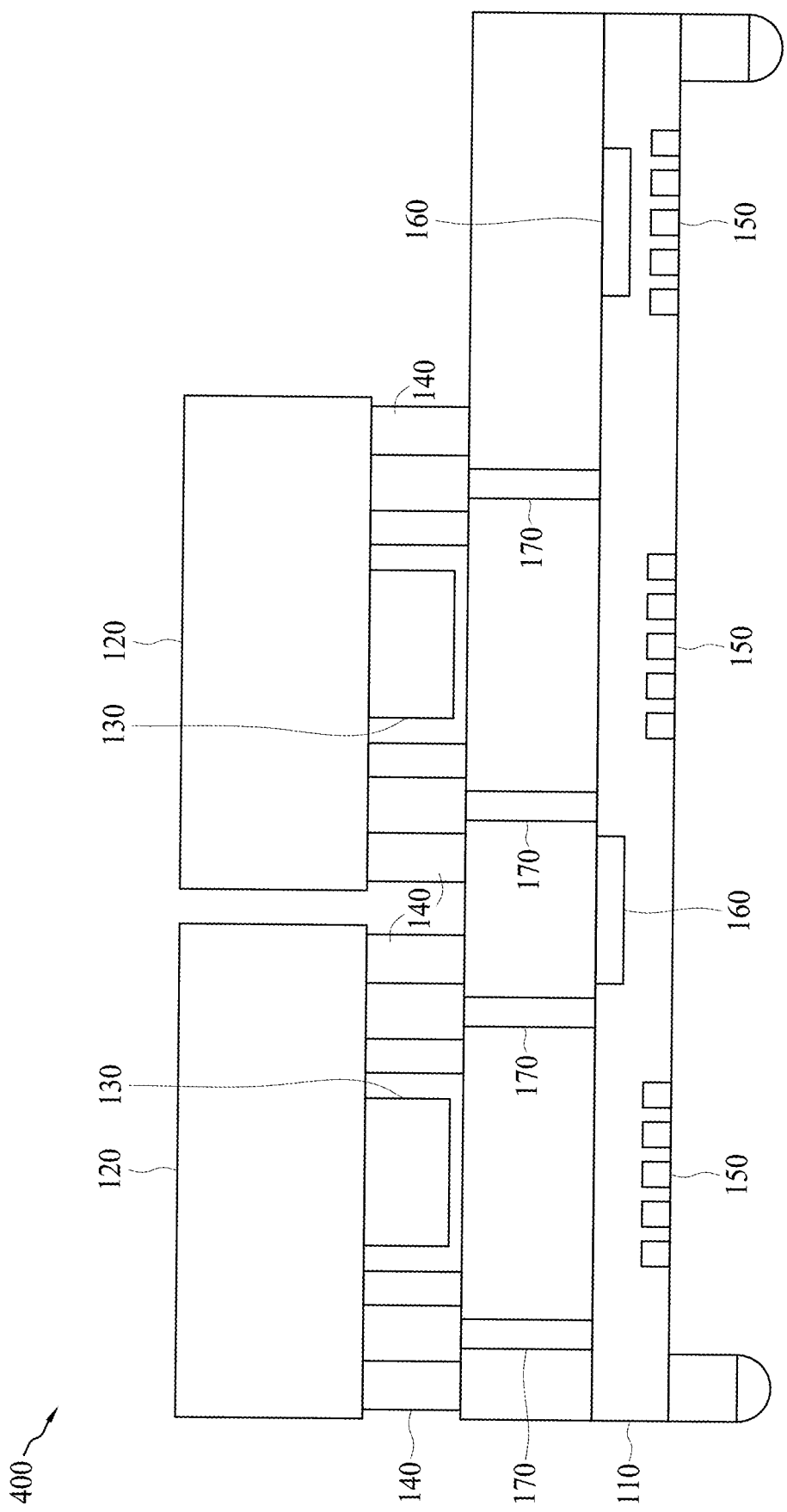
FIG. 4 illustrates a cross-sectional view of a semiconductor package in accordance with some embodiments of the present disclosure.

FIG. 4 illustrates a cross-sectional view of a semiconductor package 400 in accordance with some embodiments of the present disclosure. Referring to FIG. 4, inductors 150 and capacitors 160 are arranged on the side of the substrate 110 that does not face the die 120. The inductors 150 can be spiral inductors or 3D inductors. The space and area saved may be used for accommodating other components.

Figure 5:
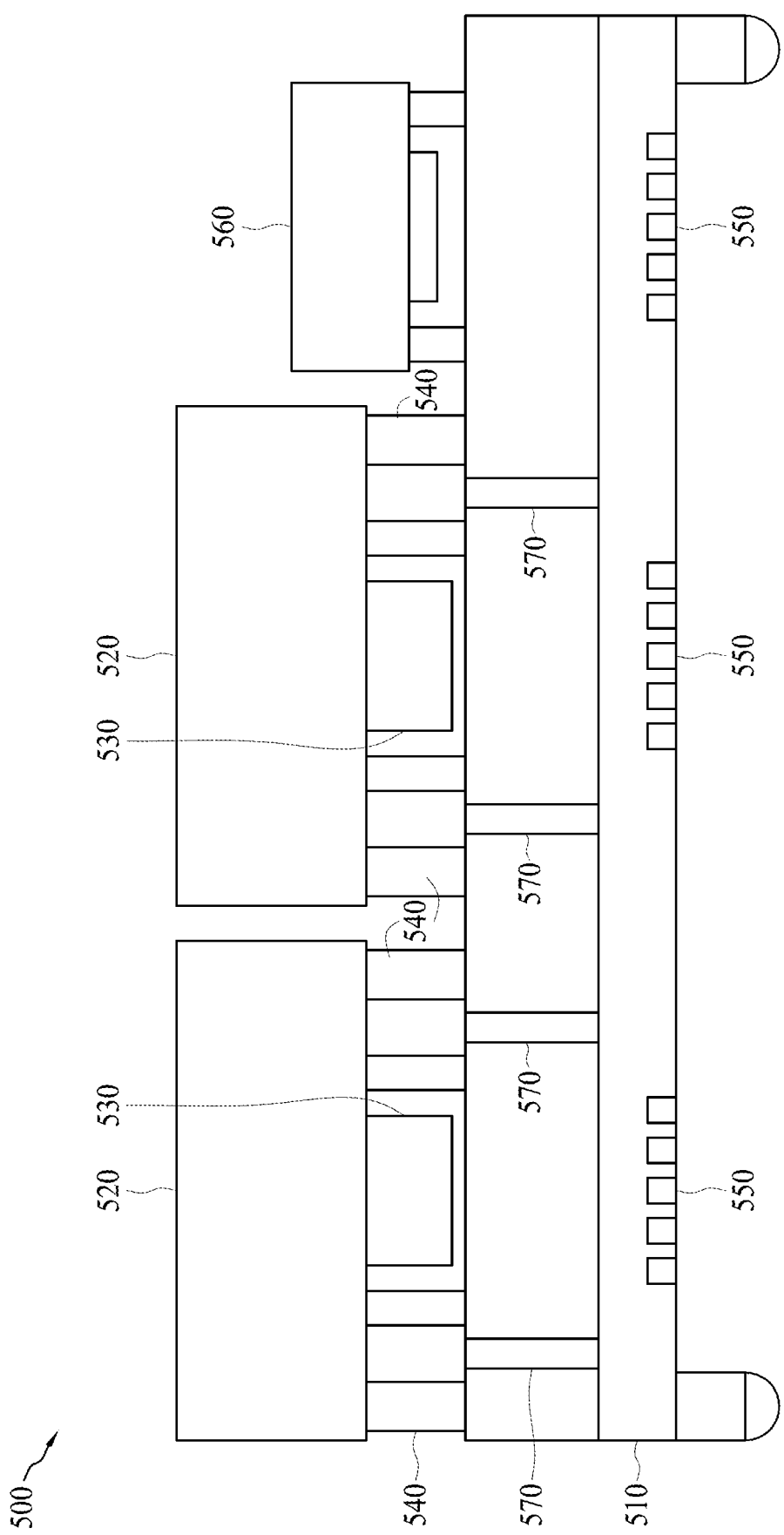
FIG. 5 illustrates a cross-sectional view of a semiconductor package in accordance with some embodiments of the present disclosure.

In some embodiments, certain modules can be designed based on application needs. For example, a capacitor bank can be separately mounted on a substrate, and inductors can still be formed or disposed in the substrate. FIG. 5 illustrates a cross-sectional view of a semiconductor package 500 in accordance with some embodiments of the present disclosure. Referring to FIG. 5, the semiconductor package 500 includes a substrate 510, a die 520, component structures 530, a sealing ring 540, inductors 550, and through hole connectors 570. In some embodiments, the substrate 510, the die 520, the component structures 530, the sealing ring 540, the inductors 550, and the through hole connectors 570 are similar to and can be described with reference to the substrate 110, the die 120, the component structures 130, the sealing ring 140, the inductors 150, and the through hole connectors 170, respectively. In some embodiments, the inductors 550 are formed or disposed on the side of the substrate 510 that does not face the die 520, and a capacitor bank 560 is mounted on the other side of the substrate 510.

Figure 6:
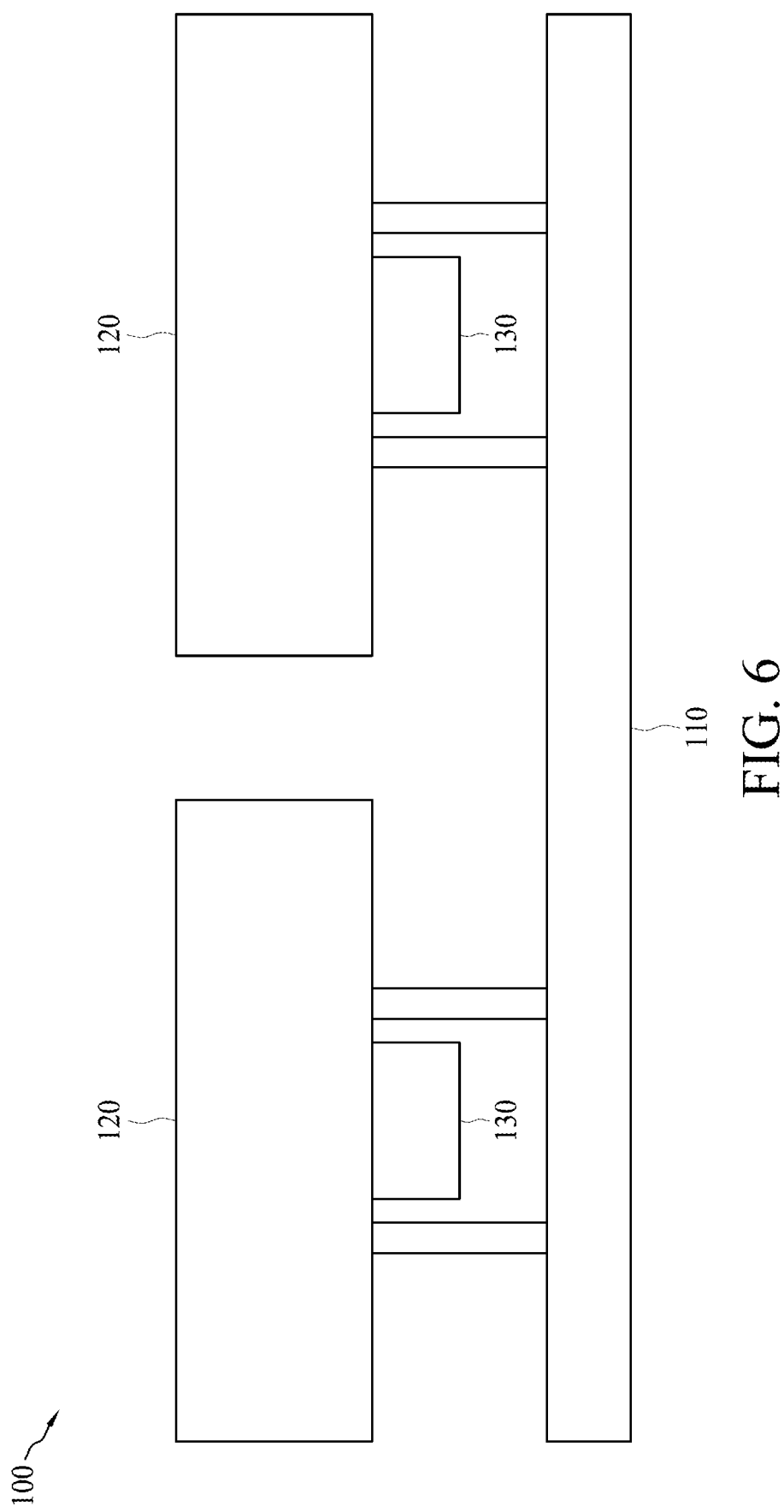
FIG. 6 illustrates a method of manufacturing a semiconductor package in accordance with some embodiments of the present disclosure.
Figure 7:
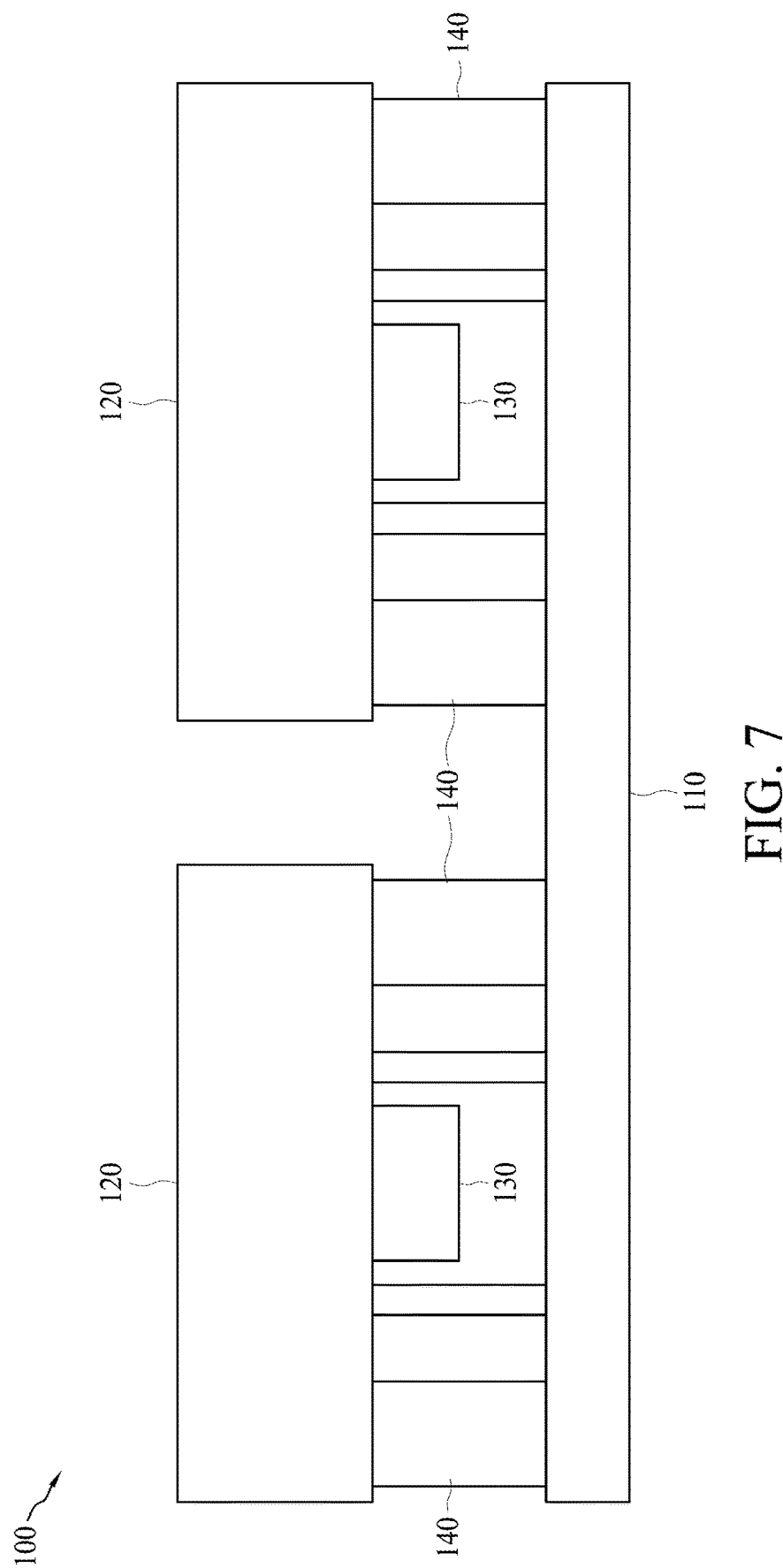
FIG. 7 illustrates a method of manufacturing a semiconductor package in accordance with some embodiments of the present disclosure.

FIGS. 6 and 7 illustrate a method of manufacturing a semiconductor package 100 in accordance with some embodiments of the present disclosure. Referring to FIG. 6, the substrate 110 is provided. The at least one die 120 is mounted on the substrate 110, and the at least one die 120 includes the component structures 130 operating with acoustic waves. The component structures 130 are arranged on a side of the at least one die 120 that faces the substrate 110.

Referring to FIG. 7, the sealing ring 140 is provided between the at least one die 120 and the substrate 110. The sealing ring 140 surrounds the component structures 130, so as to protect the at least one die 120.

Furthermore, an inductor 150 is formed or disposed in the substrate 110 for impedance matching. Thus, the semiconductor package 100 is formed, as shown in FIG. 1.

The substrate 110 can be a circuit substrate, a glass carrier or a silicon wafer. If the substrate 110 is a wafer-level substrate, a wafer-level semiconductor package can be formed by further cutting the wafer-level substrate. In some embodiments, mounting a die on the wafer-level substrate includes a wafer bonding process. In some embodiments, mounting a die on the wafer-level substrate includes a capping process.

Figure 8:
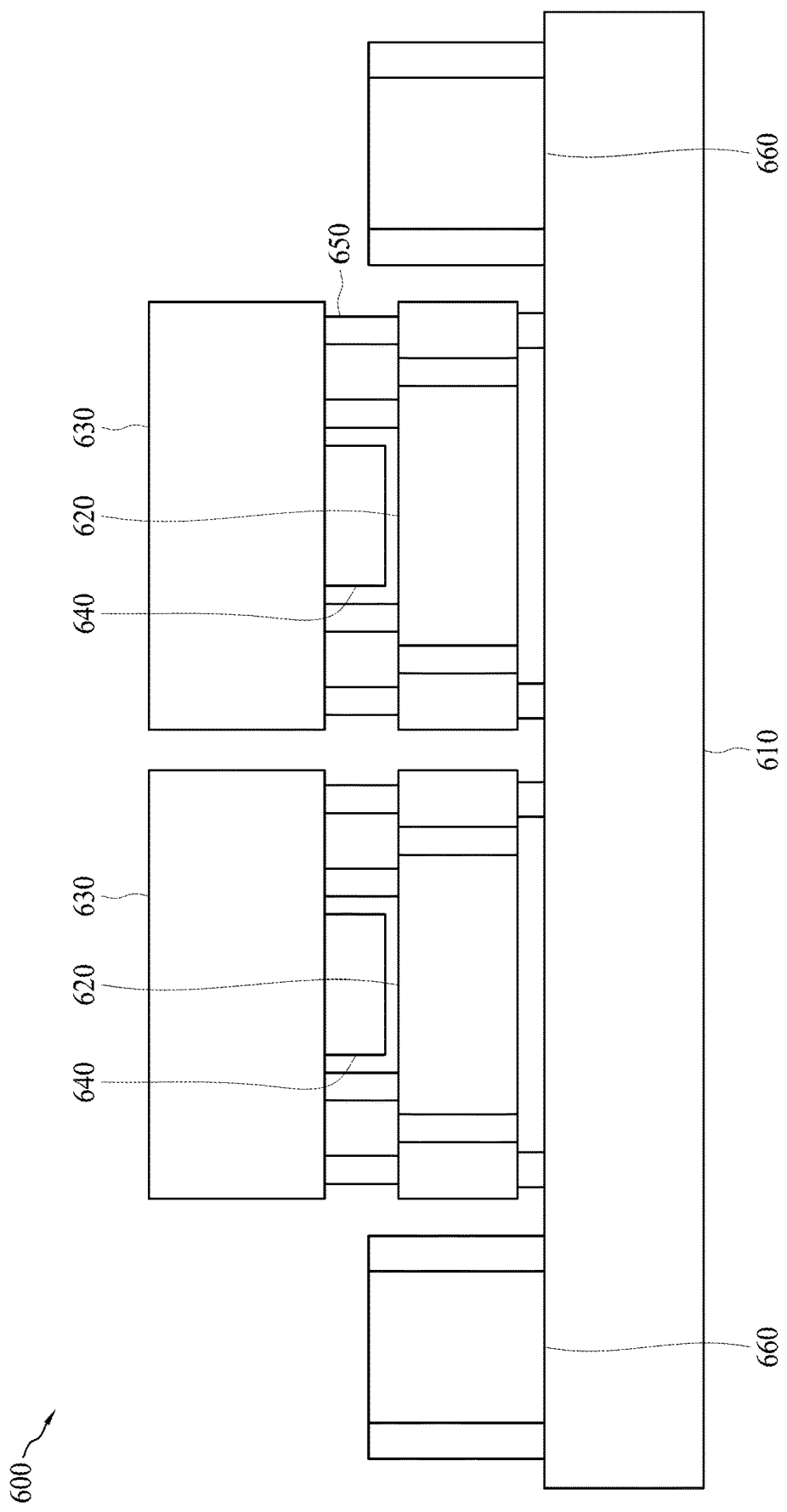
FIG. 8 illustrates a cross-sectional view of a semiconductor package in accordance with some embodiments of the present disclosure.

FIG. 8 illustrates a cross-sectional view of a semiconductor package 600 in accordance with some embodiments of the present disclosure. Referring to FIG. 8, the semiconductor package 600 includes a substrate 610, at least one cap 620, at least one die 630, at least one component structure 640, and a sealing ring 650. The caps 620 are disposed on the substrate 610. The dies 630 are disposed on the caps 620.

The die 630 may include an acoustic wave die. The die 630 may include bulk acoustic wave (BAW) filters and/or surface acoustic wave (SAW) filters. The die 630 may include a component structure 640 which operates acoustic waves. The sealing ring 650 is disposed between the capacitor 620 and the die 630 and surrounds the component structures 640. In order to achieve impedance matching, additional surface mounted devices (SMD) type components (e.g. high-quality (high-Q) capacitors and/or inductors) 660 are mounted on the substrate 610. In FIG. 8, relatively greater surface area of the substrate 610 is included to accommodate the impedance match circuitry, which increases the dimensions of the semiconductor package 600. Moreover, manufacturing cost is also increased because of extra SMD type components.

Some embodiments of the present disclosure take advantages of an inductor and utilization of a substrate serving as a cap for BAW filters and/or SAW filters, so as to integrate the inductor into the substrate and reduce the costs for manufacturing a semiconductor package.

Some embodiments of the present disclosure provide various design possibilities of a semiconductor package. For example, in some embodiments, an inductor and a capacitor bank may form a duplexer or a multiplexer; inductors and a capacitor bank may form a filter or internal matching circuits; and inductors and another capacitor bank may form a filter or output matching circuits.

As compared with the semiconductor package 600 as shown in FIG. 8, the substrate 110 of the semiconductor package 100 as shown in FIG. 1 can be used as a cap, and the inductor 150 is formed or disposed in the substrate 110. Thus, a three-layer structure (e.g., the semiconductor package 600) may be configured to be a two-layer structure (e.g., the semiconductor package 100) and therefore have a decreased size. Since the inductor 150, 350 for impedance matching is integrated into the substrate 110 as shown in FIGS. 2, 3 and 4, the SMD capacitors and/or inductors for impedance matching are eliminated. Hence, the overall dimensions of the semiconductor package is reduced and manufacturing costs are saved.

As used herein, the terms "substantially," "substantial," "approximately," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such a range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package, comprising:
   a carrier having a first surface and a second surface opposite to the first surface;
   a first die disposed adjacent to the first surface of the carrier, the first die having a first die surface facing the first surface of the carrier and including at least one first component structure operating with acoustic waves disposed adjacent to the first die surface of the first die;
   a first sealing ring disposed between the first die surface of the first die and the first surface of the carrier and surrounding the first component structure;
   a second die disposed adjacent to the first surface of the carrier, the second die having a second die surface facing the first surface of the carrier and including at least one second component structure operating with acoustic waves disposed adjacent to the second die surface of the second die;
   a second sealing ring disposed between the second die surface of the second die and the first surface of the carrier and surround the second component structure;
   a first passive device disposed in the carrier and exposed from at least one of the first surface and the second surface of the carrier, wherein the first passive device is an inductor and exposed from the second surface of the carrier;
   a through hole connector disposed in the carrier, wherein a top surface of the through hole connector is leveled with the first surface of the carrier; and
   a second passive device embedded in the first surface of the carrier and electrically connected to the first passive device,
   wherein the first component structure is disposed in a space defined by the first die and the carrier and the second passive device is disposed between the first die and the second die.

2. The semiconductor package of claim 1, wherein the second passive device is an inductor and exposed from the second surface of the carrier.

3. The semiconductor package of claim 2, further comprising a third passive device embedded in the second surface of the carrier and electrically connected to at least one of the first die and the second die.

4. The semiconductor package of claim 1, wherein the first passive device is a spiral inductor or a three-dimensional inductor.

5. The semiconductor package of claim 1, wherein at least one of the first die and the second die and the first passive device are impedance matching.

6. The semiconductor package of claim 1, wherein the carrier is a cap wafer.

7. The semiconductor package of claim 1, wherein the first passive device is embedded in the second surface of the carrier and electrically connected to at least one of the first die and the second die.

8. The semiconductor package of claim 1, wherein a surface of the first passive device is substantially coplanar with the second surface of the carrier.

* * * * *